United States Patent [19]

Tsuo et al.

[11] Patent Number: 4,816,294

[45] Date of Patent: Mar. 28, 1989

[54] METHOD AND APPARATUS FOR REMOVING AND PREVENTING WINDOW DEPOSITION DURING PHOTOCHEMICAL VAPOR DEPOSITION (PHOTO-CVD) PROCESSES

[75] Inventors: Simon Tsuo, Lakewood; Alison A. Langford, Boulder, both of Colo.

[73] Assignee: Midwest Research Institute, Kansas City, Mo.

[21] Appl. No.: 45,823

[22] Filed: May 4, 1987

[51] Int. Cl.$^4$ .................... B05D 3/06; B44C 1/22
[52] U.S. Cl. ..................... 427/531; 427/54.1; 427/55; 156/638; 156/643; 156/646; 156/654; 156/657; 156/662
[58] Field of Search ............ 427/53.1, 54.1, 55; 156/638, 643, 646, 662, 654, 657

[56] References Cited

U.S. PATENT DOCUMENTS

| | | | |
|---|---|---|---|
| 3,645,812 | 2/1972 | Sussman | 156/17 |
| 4,226,666 | 10/1980 | Winters et al. | 156/643 |
| 4,265,932 | 5/1981 | Peters et al. | 427/53.1 |
| 4,435,445 | 3/1984 | Allred et al. | 427/54.1 |
| 4,454,835 | 6/1984 | Walsh et al. | 427/54.1 |
| 4,498,953 | 2/1985 | Cook et al. | 156/646 |
| 4,525,381 | 6/1985 | Tanaka et al. | 427/54.1 |
| 4,597,986 | 7/1986 | Scapple et al. | 427/53.1 |
| 4,693,779 | 9/1987 | Okuhira et al. | 156/638 |
| 4,715,318 | 12/1987 | Kameyama et al. | 156/643 |

FOREIGN PATENT DOCUMENTS

| | | | |
|---|---|---|---|
| 60-52013 | 3/1985 | Japan | 118/723 |
| 60-236230 | 11/1985 | Japan | 427/54.1 |

OTHER PUBLICATIONS

A. E. Delahoy, "High Rate Photochemical Deposition of Amorphous Si from Higher Silanes," *J. Non-Crystalline Solids*, 77–78, pp. 833–836 (1985).

Holland et al., "Thermal & Photochemical promotion of Si & SiO$_2$ etching by Carbonyl difluoride", *J. Appl. Phys.* 60(7) pp. 2553–2557 (Oct. 1, 1986).

Hirose et al., "Characteristics of Photochemical Processing", *J. Vac. Sci. Technol.*, B3 (5) pp. 1445–1449 (Sep./Oct. 1985).

Ibbotson et al., "Comparison of XeF$_2$ and F-Atom reaction with Si and SiO$_2$," *Appl. Phys. Lett.* 44(12) pp. 1129–1131 (Jun. 15, 1984).

Inoue et al., "Photo-CVD of Undoped and n-type Amorphous Si Films Produced from Disilane", *Appl. Phys. Lett.* 43(8) pp. 774–778 (Oct. 15, 1983).

Jaskinski et al., "Excimer Laser-induced Deposition of Silicon Nitrich Thin Films", *J. Appl. Phys.* 61(1) pp. 431–435 (Jun. 1, 1987).

Klaus S. Shuegraf, "Photo CVD for Device Applications", In SERI/CP-211-2747, Abstracts of Presentation Large Area Thin Film Photovoltaic Deposition Workshop, pp. 65–69 (Jun. 25, 1985).

Kamisako et al., "Analysis of Deposition Rate Distribution in the Photo CVD of a-Si by a Unified Reactor w/a Lamp", *Jap. J. Appl. Phys.* vol. 23 #10 pp. L776–L778 (Oct. 10, 1984).

Kumata et al., "Photo CVD of hydrogenated α-Si films di-and Trisilane using a Low Pressure Hg Lamp", *Appl. Phys. Lett.* 48(20) pp. 1380–1382 (May 19, 1986).

(List continued on next page.)

Primary Examiner—Norman Morgenstern
Assistant Examiner—Marianne L. Padgett
Attorney, Agent, or Firm—Ken Richardson; Terry Clausen

[57] ABSTRACT

Unwanted build-up of the film deposited on the transparent light-transmitting window of a photochemical vacuum deposition (photo-CVD) chamber is eliminated by flowing an etchant into the part of the photolysis region in the chamber immediately adjacent the window and remote from the substrate and from the process gas inlet. The respective flows of the etchant and the process gas are balanced to confine the etchant reaction to the part of the photolysis region proximate to the window and remote from the substrate. The etchant is preferably one that etches film deposit on the window, does not etch or affect the window itself, and does not produce reaction by-products that are deleterious to either the desired film deposited on the substrate or to the photolysis reaction adjacent the substrate.

20 Claims, 2 Drawing Sheets

OTHER PUBLICATIONS

Numasawa et al., "Photo CVD System for Silicon Nitride Film", pp. 27-30, Journal unknown-Received Apr. 11, 1985.

Padmanabahn et al., "Insitu Etches Rate Measurement of Si with $XeF_2$", MRS vol. 68 pp. 423-453 (1986).

Rocheleau et al., "Effects of Impurities on Film Quality & Device Performance in α-Si Deposited by Photo-Assisted CVD" -rest info unknown?? IEEE?, May 198?, New Orleans.

Rothchild et al., "Visible-Laser Photochemical Etching of Cr, Mo, W," J. Vac. Sci. Technol. B5(1) pp. 414-418 (Jun./Feb. 1987).

Saitoh et al., "Optical & Electrical Properties of α-Si-films prepared by Photo CVD Deposition", *App. Phys. Lett.* 42(8) pp. 678-679 (Apr. 15, 1983).

Tamagawa et al., "Photo-Ionization Assisted Photo CVD of Silicon Nitride film by Microwave-Excited Deuterium Lamp," *Jap. J. Appl. Phys.* vol. 25, #9 , pp. L728-L730 (Sep. 9, 1986).

Tsuo et al., "Deposition & Etching of α-Si:H:F using Silane and Xenen Difluoride", In the 19th Proceedings of the IEEE Photovoltaic Specialist Conference pp. ? (May 4, 1987).

Harold F. Winters, "Etch Products from the reaction of $Cl_2$ with Al(100) and Cu(100) and $XeF_2$ with W(111) and Nb.", *J. Vac. Sci. Technol.* B3(1) pp. 9-15 (Jun./Feb. 1985).

Winters et al., "Etching of Si with $XeF_2$ Vapor," *Appl. Phys. Lett.* 34(1) pp. 70-73 Jan. 1, 1979.

Yokoyama et al., "Laser-induced Photochemical etching of $SiO_2$ studied by X-ray photoelectron spectroscopy", *Appl. Phys. Lett.* 47(4) pp. 389-391 (Aug. 15, 1985).

Yoshikawa et al., "Growth of Hydrogenated 2-Si Films by ArF Excimer laser Photodissociation of Disilane", *Jap. J. Appl. Phys.* vol. 23#2, pp. 191-193, Feb. 1984.

Zarnani et al., "Optical properties of UV Laser Photolytic Deposition of Hydrogenated α-Si", *J. Appl. Phys.* 60(7) pp. 2523-2529 (Oct. 1, 1986).

and other Si-H products

METHOD AND APPARATUS FOR REMOVING AND PREVENTING WINDOW DEPOSITION DURING PHOTOCHEMICAL VAPOR DEPOSITION (PHOTO-CVD) PROCESSES

CONTRACT ORIGIN OF THE INVENTION

The United States Government has rights in this invention pursuant to Contract No. DE-AC02-83CH10093 between the United States Department of Energy and the Solar Energy Research Institute, a Division of the Midwest Research Institute.

BACKGROUND OF THE INVENTION

1. Field of the Invention

The present invention is generally related to processes and apparatus used in photochemical vapor deposition (photo-CVD) of materials on substrates, and more particularly to removing and preventing deposition on a transparent solid medium, such as a window, that is positioned between the photon source and the photolysis region, which film, if not prevented or removed, inhibits transmission of photon energy to the photolysis region during deposition processes.

2. Description of the Prior Art

It has been found recently that some materials that are already used, or having potential for use, in thin film semiconductor devices can be deposited on substrates with a photo-CVD technique. In processes using this technique, a substrate is placed in a vacuum chamber, and a reaction gas containing atoms or molecules of the material to be deposited on the substrate is injected into the vacuum chamber. The reaction gas is then exposed to light energy, such as ultraviolet (UV) light, visible light, or infrared radiation, which breaks the molecular bonds and leaves the desired atomic or molecular species to be deposited free to bond with the substrate or with other atoms or molecules of the deposited material already on the substrate. For example, solar cells composed of a thin film of hydrogenated amorphous silicon (a-Si:H) on a substrate can be fabricated by exposing disilane gas ($Si_2H_6$) to UV light in a vacuum chamber containing the substrate. The photon energy from the UV light breaks Si-H or Si-Si molecular bonds in the $Si_2H_6$ gas, thereby freeing Si atoms to bond with other silicon atoms deposited on the substrate to build up a film of a-Si:H.

Such a photo-CVD process for producing a-Si:H films has been shown recently to produce film properties and solar cell efficiencies similar to the best a-Si:H films produced by glow discharge processes. See M. Konagai, MRS SYMP. PROC. 70, 257 (1986). Further, since this process does not involve high voltage ion bombardment, as required by glow discharge deposition, there is no ion bombardment of the substrate surface, chamber walls, and RF electrodes that causes film structural damage and impurity contamination to the deposited film. Therefore, there are substantial reasons for developing the photo-CVD process for commercial production of thin films.

However, prior to this invention, there was still a significant problem associated with the photo-CVD process that precluded efficient commercial use. While depositing the film of the desired atomic or molecular species on the substrate, a film of that material also deposits on glass or other transparent materials through which the UV or other light is introduced into the vacuum chamber. For example, if UV source light bulbs or tubes are positioned in the chamber where photo-CVD of a-Si:H is being performed, a film of a-Si:H also builds up on the surfaces of the light bulbs or tubes. On the other hand, where a transparent window is provided in the side of the vacuum chamber, and the UV light source is positioned outside the window, an a-Si:H film builds up on the inside surface of the window. In either case, the thicker the film build-up, the more it inhibits transmission of the UV light to the $Si_2H_6$ process gas, thus decreasing the photolysis and the efficiency of photo-CVD process and eventually effectively shutting down the process.

As a result, in order to continue the photo-CVD process, the vacuum chamber has to be opened to wipe or clean the deposited film from the window or bulbs, sometimes before the desired film on the substrate is even completed, particularly if a somewhat thicker film is desired. Such shut-down and opening of the vacuum chamber to clean the film off the window or bulbs is not only inefficient and labor intensive, but it is also detrimental to the integrity of the film being produced on the substrate. Specifically, impurities, such as oxygen, water vapor, aerosols, and other substances in the air degrade the desired film on the substrate. Even when one thin film can be completed before the deposition on the window or bulb totally blocks the light source, the chamber still has to be opened and cleaned before the next thin film on a substrate can be produced. Once the chamber is opened, it requires closure, pump down, and overnight heating to eliminate the impurities before another film can be produced. Therefore, it has still been a very inefficient, labor intensive process that is not conducive to commercial production. In order for photo-CVD to be a viable manufacturing technique, film deposition on the transparent window through which light is introduced to the vacuum chamber has to be eliminated.

There have been a number of attempts to solve this problem prior to this invention. All of the attempts have been effective to some extent, but also have created new problems or have not completely solved the existing problem. For example, a number of attempts have been made to solve the problem by blowing an inert purge gas, such as helium (He) on the interior surface of the transparent window in an attempt to keep the process gas away from the window. See, e.g., A. Yoshikwaw, et al., 23 JPN. J. APPL. PHYS. L91 (1984), H. Zarnani, et al., 60 J. APP. PHYS. 2523(1986), J. M. Jasinski, et al., 61 J. APPL. PHYS. 431 (1987), K. Kumata, et al., 48 APPL. PHYS. LETT. 1380 (1986), K. Tamagawa, et al., 25 JPN. J. APPL. PHYS. L728 (1986), and Y. Numasawa, et al., 15 J. ELECT. MAT. 27 (1986). The advantages of such an inert gas purge next to the window are that it does not introduce degrading impurities to the film being produced on the substrate and that it does not require moving parts. A significant disadvantage of this inert gas purge is that film deposition on the transparent window is only retarded and not prevented completely. Therefore, it does not always keep the film off the window long enough to complete a normal deposition process, especially where a thicker film on the substrate is desired, and the chamber still has to be opened, cleaned, reevacuated, and heated overnight between each substratecoating process. Also, in order to retard the film growth on the window enough to be beneficial, this inert purge technique requires large purge gas flows. Such large purge gas flows dilute the process gas, which is usually quite expensive, thus reducing efficiency of material usage. Such substantial dilution of the process gas can also adversely affect the film growth process on the substrate. This purge technique is better suited to laser photolysis because the beam can be focused to a small area at the window, as reported by A. Yoshikawa, et al., supra, H. Zarnani, et al., supra, and J. M. Jasinski, et al., supra. T. Saitoh, et al., 42 APPL. PHYS. LETT. 678 (1983), reported that a somewhat thicker film deposition on the substrate can be obtained by repetitively plasma etching the window and resuming the deposition. However, such plasma etching in the chamber requiring periodic interruption of the photo-CVD process is inefficient, can produce undesirable impurities, and detracts from the benefits of photo-CVD over normal plasma deposition.

Another approach to solve the problem, as reported by T. Inoue, et al., 43 APPL. PHYS. LETT. 744 (1983), and A. E. Delahoy, 77 & 78 J. NON-CRYST. SOLIDS 322 (1985), has been to coat the interior surface of the window with a transparent film of low vapor pressure oil, such as Fomblin, to reduce the sticking coefficient of the material being deposited. This oil coating technique has better success at retarding film growth on the window than the inner gas purge technique, but carbon from the oil is a source of degrading impurity that can have a deleterious effect on the film being grown on the substrate. Also, while the oil coating does retard film growth on the window, it still provides only enough time to deposit about a 3-$\mu$m film on the substrate. Thus, one successful substrate coating is still about all that can be expected before the chamber has to be opened again for cleaning. The U.S. Pat. No. 4,597,986, issued to R. Scapple, et al., describes an improvement whereby oil is continually applied to the window surface while the surface is wiped with a wiper blade. This latter improvement does enhance continuous production, but the carbon impurity problem renders this technique unsuitable for deposition of semiconductor films that require a high degree of purity.

U.S. Pat. No. 4,265,932, issued to Peters, discloses still another approach in which a movable UV transparent sheet is positioned between the process gas and the window so that a film is deposited on the movable sheet instead of on the window. The clean sheet is continuously unwound from a spool and drawn across the window, then wound onto another spool during the photo-CVD process so that no film build-up to inhibit UV light entering the chamber is allowed. This technique is quite effective for one substrate. Its only disadvantages are that it takes about 300 feet of sheet for the time it takes to accomplish one film deposition on a substrate, so the chamber still has to be opened after every run to change the roll of transparent sheet, and there is still the possibility of some contaminants that emanate or outgas from the sheet as it is unrolled. The U.S. Pat. No. 4,654,226, issued to R. Rochelea, et al., discloses an improvement on this movable sheet technique.

Another interesting approach illustrated by the U.S. Pat. No. 4,454,835, issued to P. Walsh, et al., is to avoid the problem by incorporating a UV light source right in the vacuum chamber without any intervening transparent windows, sheets, or bulbs. In this kind of apparatus, a lamp gas, such as argon or neon, is introduced directly into the vacuum chamber near some discharge electrodes while the process gas is introduced into the chamber near the substrate. The lamp gas is ionized right in the vacuum chamber to create a glow discharge along side the process gas by the electrodes to emit the required UV light, while the film is deposited from the process gas onto the substrate. Since the lamp and deposition regions are in a common vacuum chamber, it is difficult to distinguish between the effects of a remote plasma that may include at least some of the process gas and photolysis of the process gas. This type of system may yet become successful in producing high quality films, but the deposition mechanism is still uncertain, and since the lamp and process gases do mix in the vacuum chamber, the problem of impurities still has to be considered.

Consequently, while the actual photo-CVD process has great potential for producing at least some very commercially desirable thin film semiconductor devices, such as the a-Si:H solar cells discussed above, there has still been a critical need for an effective method and apparatus for eliminating the film build-up on the vacuum chamber window where UV light is introduced in order to make this photo-CVD process commercially viable. Such a solution should meet at least four criteria, as follows: (1) It should not reduce window transparency; (2) It should eliminate deposition on the window while not adversely affecting deposition on the substrate; (3) It should be inert or benign to the film deposition on the substrate and not introduce undesirable impurities into the chamber which would degrade the film deposited on the substrate; and (4) It should be continuously effective without requiring periodic opening of the chamber so that efficient, continuous production of film depositions on successive substrates can be accomplished.

SUMMARY OF THE INVENTION

Accordingly, it is a general object of the present invention to provide a method and apparatus for preventing deposition film build-up on the interior surface of a light-admitting window in a photo-CVD chamber.

A more specific object of the present invention is to provide a method and apparatus for preventing build-up of a deposition film on the light-admitting window of a photo-CVD chamber that does not reduce the transparency of the window.

Another specific object of the present invention is to provide a method and apparatus for preventing build-up of a deposition film on the light-admitting window of a photo-CVD chamber that does not adversely affect deposition on the substrate.

Still another specific object of the present invention is to provide a method and apparatus for preventing build-up of a deposition film on the light-admitting window of a photo-CVD chamber that does not introduce undesirable impurities into the vacuum deposit chamber that would degrade the film deposited on the substrate.

Yet another specific object of the present invention is to provide a method and apparatus for preventing build-up of a deposition film on the light-admitting window of a photo-CVD chamber that accommodates continuous deposition of films on successive substrates without having to open the chamber to the atmosphere after each deposition on a single or even on several substrates.

A still further object of this invention is to provide a method and apparatus for preventing build-up of a-Si:H on the UV-admitting window of a vacuum deposition chamber.

Additional objects, advantages and novel features of the invention will be set forth in part in the description that follows, and in part will become apparent to those skilled in the art upon examination of the following or may be learned by the practice of the invention. The object and the advantages of the invention may be realized and attained by means of the instrumentalities and in combinations particularly pointed out in the appended claims.

To achieve the foregoin and other objects and in accordance with the purposes of the present invention, as embodied and broadly described herein, the method of this invention may broadly comprise the steps of flowing an etchant capable of breaking bonds of the desired atomic or molecular species being deposited into the part of the photolysis region of the chamber immediately proximate to the interior surface of the window and remote from the substrate and from the point where the process gas is introduced into the chamber. The etchant eliminates deposition on the window surface and preferably creates a depletion zone next to the window where excess etchant is consumed by reaction and process gas is depleted.

To further achieve the objects and purposes described above. The apparatus of this invention may broadly comprise a photo-CVD vacuum chamber with a process gas inlet remote from the window and an etchant inlet nozzle adjacent the window and remote from the process gas inlet and from the substrate. Since opening and cleaning is not required after each substrate coating, a load-lock chamber can also be provided for continuous processing.

BRIEF DESCRIPTION OF THE DRAWINGS

The accompanying drawings, which are incorporated in and form a part of the specification illustrate preferred embodiments of the present invention together with the description, the drawing serve to explain the principles of the invention.

In the drawings.

DETAILED DESCRIPTION OF THE PREFERRED EMBODIMENTS

The present invention includes a method of preventing deposition film build-up on a light-admitting window in a photo-CVD chamber by purging the interior window surface and the immediately adjacent photolysis region with an etching material. The apparatus of this invention, which will be described in more detail below, is used to implement this method.

In photo-CVD processes, a process gas bearing a desired atomic or molecular species to be deposited is exposed to photon energy. The photon energy breaks molecular bonds in the process gas either directly or indirectly via a sensitizing agent, thereby freeing the desired atomic or molecular species to bond with other atoms or molecules on a substrate. As the process continues, a film of the desired material grows on the substrate.

Figure 1:
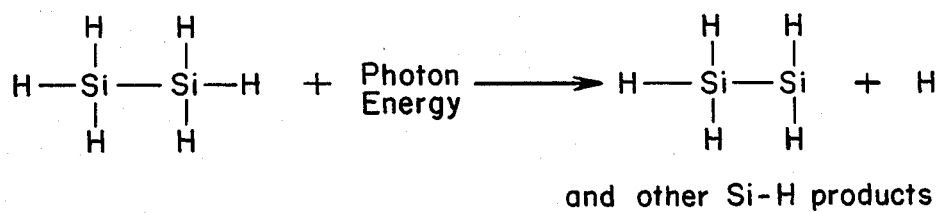
FIG. 1 is a symbolic description of the UV photolysis reaction of $Si_2H_6$ as known in the art.
Figure 2:
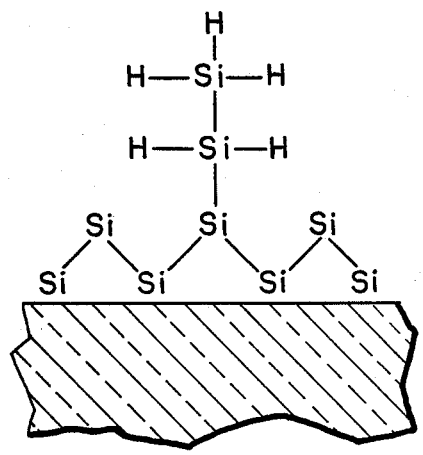
FIG. 2 is a symbolic description of the photo-CVD deposition of a-Si:H as known in the art.

For example, as illustrated in FIG. 1, it is known that when a disilane gas ($Si_2H_6$) is exposed to UV light, it breaks into $Si_xH_y + H$ components, e.g., $Si_2H_5$. The free bond on the Si atom then bonds with other Si atoms on a substrate to grow a film of hydrogenated amorphous silicon (a-Si:H), as illustrated in FIG. 2. This process occurs in an enclosed, sealed, evacuated chamber, and the UV light rays are typically introduced into the chamber through a transparent window in a wall of the chamber.

Figure 3:
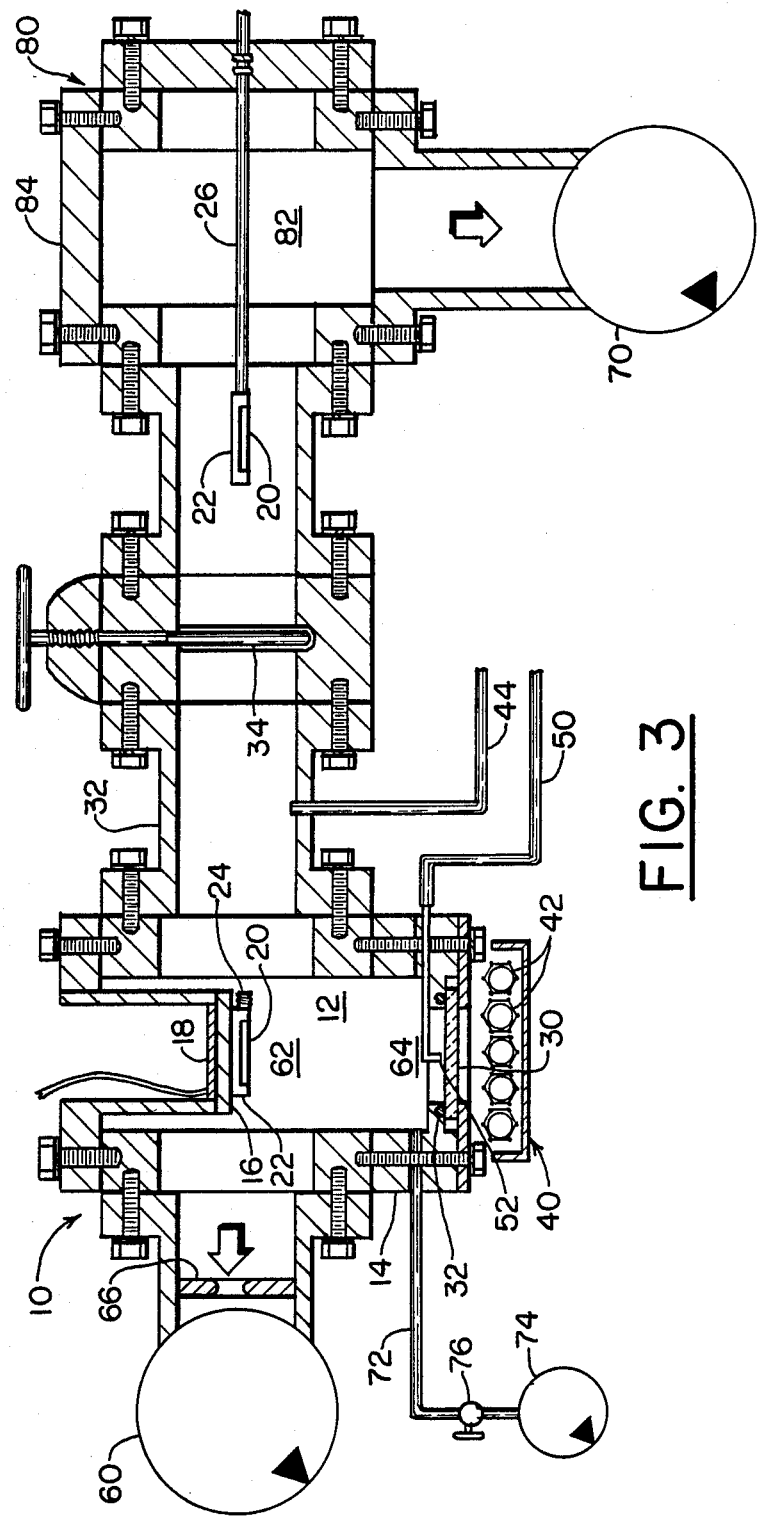
FIG. 3 is a cross-sectional view of a photo-CVD chamber according to this invention.

A cross-section of photo-CVD apparatus 10 according to the present invention is illustrated in FIG. 3. The photo-CVD apparatus 10 includes a chamber 12 enclosed by sidewalls 14. A substrate mounting structure 16 extends into the chamber 12 from one side and is adapted to mount and hold a substrate 20 in stationary position in the chamber 12 during the film deposition process. A heater unit 18 is connected to the substrate mounting structure for heating the substrate 20, if desired, during the photo-CVD process in order to control film properties, such as adhesion and hydrogen content.

In the chamber sidewall 14 opposite the substrate mounting structure is a transparent window 30 with appropriate seals 32 around its perimeter to maintain the seal and vacuum integrity of the chamber 12. A photon light source 40, illustrated in FIG. 3 as comprising an Hg lamp 42 for producing UV light, is positioned adjacent the outside surface of the window 30. Of course other kinds of lamps or light sources for producing UV or other light, as needed for any particular photo-CVD process desired, can also be used as photon light source 40.

The substrate 20 is shown fastened on a carrier 22 that is adapted for mounting on the substrate mounting structure 16. The carrier 22 is also illustrated with a coupling component 24 adapted for releasable attachment to an extractor rod 26 which is mounted so that it can slide in a load-lock apparatus 80, which will be described below. A neck piece 32 connects the photo-CVD chamber 12 to a gate valve 34 positioned between the photo-CVD chamber 12 and a vacuum loading chamber 82 in the load lock apparatus 80. A process gas feeder pipe 44 is connected to the neck piece 32 for feeding process gas into the photo-CVD chamber 12.

An etch gas feeder line 50 is connected to a nozzle 52 positioned adjacent the inside surface of the window 30. An etch gas according to this invention is directed onto the inside surface of window 30 by this nozzle 52, as will be described in more detail below.

A vacuum pump 60 is connected to the end of the photo-CVD chamber 12 that is opposite the neck piece 32 where the process gas is introduced into the chamber 12. This vacuum pump 60 is used to produce and maintain a high quality vacuum in the photo-CVD chamber 12 and to maintain process gas flow. A turbo-type vacuum pump is preferred, though not necessarily essential, for this purpose. Chamber pressure can be controlled by an orifice or throttle valve 66 between the chamber 12 and the pump 60. A second vacuum pump 70 is connected to the load-lock chamber 82 for evacuating the load-lock chamber as substrates 20 are changed, as will be described below.

In operation, with the gate valve 34 closed, the vacuum pump 60 is actuated to pull a high quality vacuum in photo-CVD chamber 12. Once evacuated, the chamber 12 can also be heated for a sufficient time to eliminate any residual water vapor that may have been introduced into chamber 12 from the atmosphere. At the same time, a substrate 20 to the coated can be mounted on a carrier 22 and attached to the rod 26 in load-lock chamber 82 through a hatch 84. The hatch 84 is then closed and sealed, and the vacuum pump 70 is actuated to pull all air out of load-lock chamber 82 and to create a vacuum therein to match the vacuum in photo-CVD chamber 12.

When the chambers 12 and 82 are evacuated and purified as described above, the gate valve 34 can be opened, and the rod 26 can be manipulated from outside load-lock chamber 82 to mount the carrier 22 and substrate 20 in the substrate mounting structure 16. Appropriate channels or guides (not shown) or other suitable structures known in the art can be provided to retain the carrier 22 on the mounting structure 16. The rod 26 can then be manipulated to detach it from the coupler 24 of carrier 22. Once it is detached, the rod 22 can be withdrawn from the photo-CVD chamber 12, and the gate valve 34 can be closed to once again seal the photo-CVD chamber 12 from the lock-load chamber 82.

With the substrate 20 positioned on the mounting structure 16 in chamber 12, and with the vacuum pump 60 operating to maintain the vacuum in chamber 12, the process gas feed, etch gas feed and UV light source 40 can be turned on sequentially or simultaneously to start the photo-CVD process according to this invention. During this photo-CVD process, the process gas is fed into chamber 12 through the process gas feed line 44. The process gas flows through chamber 12 to the primary photolysis area 62 of the chamber 12 between the substrate 20 and the window 30. In this area 62, the process gas is exposed to the photon energy from the light source 40, which photolyzes or breaks molecular bonds and allows the desired atoms or molecules to bond with atoms or molecules on the substrate 20 to grow the desired film thereon.

Simultaneously, as the desired film is being grown on the substrate 20, the nozzle 52 directs etch gas onto the interior surface of the window 30. The etch gas not only tends to purge process gas away from the window 30, but more importantly, it breaks bonds between the desired atoms both in the process gas and in those that may have deposited on the surface of the window 30. The volume and pressure of this etch gas is adjusted so that it is just sufficient to prevent the desired atoms from the process gas from depositing and building a film on the surface of window 30 and to confine the reaction of the etch gas with the process gas to an area 64 adjacent the window 30 and not in the primary photo-reaction or photolysis area 62 adjacent the substrate 20. As this etch gas reacts with the process gas, it creates a depletion region in the area 64 adjacent the window where the process gas is essentially consumed in reaction with the etch gas.

In order to function as described above, the etch gas, of course, must be of a type chosen to react with and break bonding between the desired atoms or molecules that would otherwise deposit and build up a film on the window 30. However, it is also important that the etch gas not react with the window 30 or reduce its transparency. Further, the etch gas should react quickly and thoroughly enough with the process gas in the area 64 adjacent the window 30 so that it is substantially depleted in this area 64 and cannot migrate to any significant extent into the primary photolysis area 62 or to the desired film build up on the substrate 20. Finally, it is also important that the by-products of the etching reaction be inert or benign in the photo-CVD process.

To illustrate the principles of this invention, the desired film to be deposited on the substrate 20 can be a-Si:H. Such photo-CVD process utilizes $Si_2H_6$ process gas exposed to UV light in chamber 12. The UV light can be generated by the Hg lamps 42 in light source 40 and introduced into the chamber 12 through window 30. Window 30 can be fabricated of UV grade quartz, which is primarily silicon dioxide ($SiO_2$), or it can be fabricated of $Al_2O_3$, or other Uv transparent materials. The primary photo-CVD reaction, as illustrated in FIGS. 1 and 2, occurs in the area 62 of chamber 12 adjacent the substrate 20 shown in FIG. 3.

The etch gas used in this example is Xenon difluoride ($XeF_2$), which is a white powder with vapor pressure of 3.8 Torr at 25° C. $XeF_2$ spontaneously etches Si with rates as large as 7000 Å/min without requiring the application of heat, a plasma, or ion bombardment, yet it will not etch the $SiO_2$ window in these conditions. $XeF_2$ also reacts very rapidly with silane ($SiH_4$) and disilane ($Si_2H_6$). Therefore, with proper proportioning of this $XeF_2$ etch gas to the $Si_2H_6$ process gas, this rapid reaction can create a process gas depletion zone 64 adjacent the window 30 while preventing the $XeF_2$ from reaching the substrate 20 or even from making any significant incursion into the primary photolysis zone 62.

The by-products of $XeF_2$ etching Si deposited on the interior surface of the quartz window 30 are $SiF_4$, Xe, and HF gases. The $SiF_4$ gas by-product is a strong-bonded gas that does not dissociate in the UV wavelengths used. The Xe gas is, of course, inert. Also, the products of the reaction of $XeF_2$ with $SiH_4$ and $Si_2H_6$ process gas are $SiF_4$, Xe, and HF. While HF is a strong acid reactant with metals, it does not etch Si and is essentially benign in this situation. Therefore, the $XeF_2$ etchant in this a-Si:H photo-CVD process meets the requirements described above. A very small percentage of F from this process might end up incorporated in the film on the substrate, such as in the range of approximately 0.5 to 3 atomic percent. However, it has been reported that such small amounts of F in an a-Si:H film, i.e., an a-Si:H(F) film, actually enhances the electrical properties of the film. Therefore, it is not detrimental at all to the use of this process for fabricating semiconductor or solar cell devices.

The slight fluorination of the a-Si:H film deposited on the substrate 20 can be eliminated almost entirely, if desired, by drawing some vacuum through a secondary suction pipe positioned principally in the depletion region 64 adjacent the window 30. Such a secondary suction pipe 72 is shown in FIG. 3 connected to a secondary vacuum pump 74. An adjustable valve 76 is also provided in pipe 72 for metering the secondary vacuum drawn from region 64 to attain a balance with the primary vacuum drawn through throttle valve 66. In this manner the secondary vacuum drawn through pipe 72 can be optimized to draw the by-products of the etchant reaction, including F, directly from the region 64 without unnecessary interference with the flow of process gas to the primary photolysis region 62.

In the example described above, the substrate 20 was positioned about 2 cm from the window 30. The $Si_2H_6$ process gas was introduced through line 44 into the chamber 12 upstream of the substrate 20. The $XeF_2$ etchant was introduced through nozzle 52 positioned adjacent the window 30. The nozzle 52 was a ⅛" O.D. tube opening about 2 mm from the quartz window 30. The photolysis source was a low pressure mercury lamp with 185 nm output of 6 mW/$cm_2$ at a distance of 3 cm. The lamp intensity was monitored with a calibrated thermopile detector and an interference filter to select the wavelength. The process gas was 100% $Si_2H_6$, and the etchant was $XeF_2$ with He as a gas carrier. The relative flow rates of the process and etchant gases were adjusted so the window 30 transparency was maintained and the $XeF_2$ was consumed in the region 64 near the window without etching the a-Si:H(F) film being deposited on the substrate 20. The deposition rate and material properties were examined as functions of the gas flow rates, pressure, temperature, and lamp intensity, as shown in Table I below. The films were characterized for thickness, light and dark conductivity, bandgap, activation energy, and infrared absorption X-ray photoelectron spectroscopy (XPS) for fluorine content.

TABLE I

Deposition parameter ranges.

| Parameter | Low | High | Units |
|---|---|---|---|
| $T_{subst.}$ | 240 | 315 | °C. |
| $Si_2H_6$ flow | 10 | 30 | sccm |
| $XeF_2$ flow | 0.1 | 0.3 | sccm |
| He flow | 5 | 50 | sccm |
| $P_{total}$ | 0.5 | 3 | Torr |
| $I_{185nm}$ | 3 | 6 | mW/cm$^2$ |

The results confirmed that the window transparency was maintained effectively and continually throughout the photo-CVD of as many a-Si:H(F) films as desired, and the film characterizations show that the observed and measured properties are of sufficiently high quality for semiconductor device use. The photo to dark conductivity gain is in excess of $10^5$. The balance between maintaining effective etching at the window 30 and efficient deposition of a-Si:H(F) at the substrate 20 was quite easy to maintain over a wide range of parameters. At one extreme end of this range, with insufficient flow of $XeF_2$, deposition of a-Si:H(F) film started around the edges of the window 30. Increasing the $XeF_2$ flow caused the diameter of the clear region on the window 30 to increase until the film disappeared. At the other extreme of this range, excessive $XeF_2$ etched the deposited a-Si:H(F) film off the substrate 20 as well.

Since it is quite easy to maintain the window 30 clear of film deposits according to this invention there is no problem with UV light blockage before a desired film thickness on the substrate 20 is obtained, regardless of how long it takes. Further, and perhaps equally as important, the ability to maintain the window clear of film build-up allows a continuous succession of substrates to be coated without having to open the chamber 12, thus eliminating the need to open the chamber to clean and then close it, pump it down, and heat it for an extended period to eliminate impurities between each substrate coating. Therefore, as shown in FIG. 3, the load-lock and the vacuum pump 70 can be used to pump down the load-lock chamber 82 to eliminate air and impurities and to match the vacuum in chamber 12. When the substrate 20 in chamber 12 is coated as desired, the process gas and etch gas are turned off, and the gate valve 34 is opened to allow insertion of the rod 26 into the photo-CVD chamber 12 to attach and remove the carrier 22 and substrate 20. The gate valve 34 is then closed, and the hatch 84 is opened to remove the finished substrate 20. Another substrate 20 is then mounted in carrier 22 and the hatch 84 is closed and sealed. The pump 70 again evacuates load-lock chamber 82, the gate valve 34 is opened, and the new uncoated substrate 20 is inserted into chamber 12 and mounted on mounting apparatus 16. The rod 26 is then uncoupled from carrier 22 and withdrawn so that gate valve 34 can then be closed again, and the photo-CVD process can be repeated immediately to deposit a film on the new substrate 20. This process can continue indefinitely without opening photo-CVD chamber 12 to the atmosphere, yet with assurance that the window 30 can be kept clear according to the present invention.

The method and apparatus of this invention to maintain window transparency in photo-CVD processes can be applied to a variety of materials and is not limited to the use of $XeF_2$ etchant in a-Si:H(F) photo-CVD described in the example above. Both the etchant and the depositing film can be varied while still fulfilling the requirements described above. For example, other materials that are spontaneously etched by $XeF_2$ include W and Nb. Also, photo-CVD of metals, while having many potential device applications, also has suffered from complications due to window blocking deposition. Other etchants, such as $Cl_2$, will react spontaneously with metals, such as Al and Cu.

Further, because of the light present in photo-CVD processes, a new class of etchants that are activated by light are particularly suited to this application. For example, although $NF_3$ and $SF_6$ do not etch Si spontaneously, they do become effective etchants of Si when photolyzed with UV light. Other etch deposition pairs effective when photolyzed with UV light irradiation include $NF_3$ etchant with $SiO_2$ deposition and HCl etchant with GaAs deposition. Similarly, when photolyzed with visible light, $NF_3$ and $Cl_2$ become etchants for Mo, W, and Cr, and infrared irradiation makes $COF_2$ an etchant of $SiO_2$. The combinations of such materials are particularly appropriate for use in accordance with this invention where the same photolysis light source can be used to induce the etching as well as the deposition.

The foregoing is considered as illustrative only of the principles of the invention. Further, since numerous modifications and changes will readily occur to those skilled in the art, it is not desired to limit the invention the exact construction and operation shown and described, and accordingly all suitable modifications and equivalents may be resorted to falling within the scope of the invention as defined by the claims which follow.

The embodiment of the invention in which an exclusive property or privilege is claimed are defined as follows:

1. The method of depositing a film of a desired atomic or molecular species on a substrate by photochemical vapor deposition, comprising the steps of:

positioning the substrate in an evacuated deposition chamber;

directing photon light energy through a transparent solid medium into a primary photolysis region in said evacuation chamber positioned between said substrate and said transparent medium;

flowing a process gas comprising the desired atomic or molecular species to be deposited as a component part of said process gas into said primary photolysis region, exposing said process gas to said photon light energy in said primary photolysis region to break molecular bonds in said process gas to free the desired atomic or molecular species, and allowing said desired atomic or molecular species to deposit on said substrate;

flowing an etchant capable of etching and breaking bonds between the desired atomic or molecular species into said chamber simultaneously with said flow of process gas and directing said flow of etchant to a part of said primary photolysis region that is immediately adjacent said transparent solid medium and remote from said substrate and allowing said etchant to react with said desired atomic or molecular species on and immediately adjacent said transparent solid medium to prevent deposition build-up of the desired atomic or molecular species on said transparent solid medium; and balancing the respective flow volumes and pressures of the process gas and the etchant into said chamber in such a manner that the etchant effectively prevents deposition build-up of the desired atomic or molecular species on the transparent solid medium and is substantially consumed in reaction to create a depletion region in the part of the photolysis region adjacent said transparent solid medium and before reaching said substrate.

2. The method of claim 1, including the step of selecting said etchant to be a material that produces only etching reaction by-products that are not deleterious to the film deposited on the substrate.

3. The method of claim 2, including the step of selecting said etchant to be a material that produces only etching reaction by-products that are substantially all gases benign to the process gas and to the film deposited on the substrate.

4. The method of claim 2, including the step of selecting said etchant to be a material that is not reactive with said transparent solid medium.

5. The method of claim 4, including the step of selecting $Si_2H_6$ as said process gas, $XeF_2$ as said etchant, and $SiO_2$ as said transparent solid medium, and directing UV light through said transparent solid medium into said primary photolysis region of said vacuum chamber.

6. The method of claim 4, including the step of depositing a film of W on said substrate, and including the step of selecting $XeF_2$ as said etchant.

7. The method of claim 4, including the step of depositing a film of Nb on said substrate, and including the step of selecting $XeF_2$ as said etchant.

8. The method of claim 4, including the steps of depositing Al on said substrate and selecting $Cl_2$ as said etchant.

9. The method of claim 4, including the steps of depositing Cu on said substrate and selecting $Cl_2$ as said etchant.

10. The method of claim 4, including the steps of depositing Si on said substrate, selecting $NF_3$ as said etchant, and directing UV light through said transparent solid medium into said primary photolysis region of said evacuated chamber.

11. The method of claim 4, including the steps of depositing Si on said substrate, selecting $SF_6$ as said etchant and directing UV light through said transparent solid medium into said primary photolysis region of said evacuated chamber.

12. The method of claim 4, including the steps of depositing $SiO_2$ on said substrate, selecting $NF_3$ as said etchant, and directing UV light through said transparent solid medium into said primary photolysis region of said evacuated chamber.

13. The method of claim 4, including the steps of depositing GaAs on said substrate, selecting HCl as said etchant and directing UV light through said transparent solid medium into said primary photolysis region of said evacuated chamber.

14. The method of claim 4, including the steps of depositing a material selected from the group consisting of Mo, W, and Cr on said substrate, selecting $NF_3$ as said etchant, and directing visible light through said transparent solid medium into said primary photolysis of said evacuated chamber.

15. The method of claim 4, including the steps of depositing a material selected from the group consisting of Mo, W, and Cr on said substrate, selecting $Cl_2$ as said etchant, and directing visible light through said transparent solid medium into said primary photolysis of said evacuated chamber.

16. The method of claim 4, including the steps of depositing $SiO_2$ on said substrate, selecting $COF_2$ as said etchant, and directing infrared radiation through said transparent solid medium into said primary photolysis region of said evacuated chamber.

17. In the process of depositing a film of a desired atomic or molecular species on a substrate by photo-CVD in an evacuated chamber having a transparent solid medium between a photon source and the substrate and a primary photolysis region in the chamber between the substrate and the transparent solid medium, the improvement comprising the steps of:

simultaneously introducing a silicon-bearing process gas into said chamber at a process gas inlet positioned remote from said transparent solid medium and allowing said process gas to flow into said primary photolysis region;

introducing a $XeF_2$ etchant capable of breaking bonds between said desired atomic or molecular species into said photolysis region at an etchant inlet positioned proximate to said transparent solid medium and remote from both said substrate and said process gas inlet; and directing UV radiation from said photon source through said transparent solid medium into said primary photolysis region.

18. The improvement of claim 17, including the steps of maintaining said substrate at a temperature in the range of about 240° C. to 315° C., maintaining a flow of $Si_2H_6$ in the range of about 10 to 30 sccm, maintaining said $XeF_2$ flow in the range of about 0.1 to 0.3 sccm, maintaining the pressure in the chamber in the range of about 0.5 to 3 Torr, and maintaining said UV light at about 185 nm with intensity in the range of about 3 to 6 $mW/cm^2$.

19. The improvement of claim 17, including the step of positioning a suction pipe proximate to said transparent solid medium and remote from said substrate and removing etching reaction by-products from said chamber through said pipe.

20. In the process of depositing a film of a desired atomic or molecular species on a substrate by photo-CVD, wherein a substrate is positioned in an evacuated chamber and photon energy is directed through a transparent solid medium into a photolysis region in said evacuated chamber between said substrate and said transparent solid medium, and a process gas bearing the desired atomic or molecular species bonded to other elements, which bonds are breakable by the photon energy in the photolysis region, is also flowed into the evacuated chamber and exposed to the photon energy the improvement comprising the steps of:

separating said photolysis region into a primary photolysis deposition region adjacent said substrate where deposition photolysis of said process gas occurs and a depletion region adjacent said transparent solid medium where process gas is depleted by flowing an etchant capable of breaking bonds between the desired atomic or molecular species and creating benign reaction by-products into the photolysis region immediately adjacent said transparent solid medium and remote from said substrate, and balancing the respective flows of process gas and etchant into said photolysis region in such a manner that substantially all of said etchant is consumed adjacent said transparent solid medium, and thereby confining said depletion region to the part of said photolysis region immediately adjacent said transparent solid medium and prohibiting it from extending to the part of the photolysis region adjacent said substrate.

* * * * *